United States Patent [19]

Iwasaki et al.

[11] 4,028,111
[45] June 7, 1977

[54] LIGHT-SENSITIVE LITHOGRAPHIC PRINTING PLATE

[75] Inventors: Masayuki Iwasaki; Hiroshi Misu, both of Minami-ashigara; Shizuo Miyano, Odawara, all of Japan

[73] Assignee: Fuji Photo Film Co., Ltd., Minami-ashigara, Japan

[22] Filed: Feb. 25, 1975

[21] Appl. No.: 552,902

[30] Foreign Application Priority Data

Feb. 25, 1974 Japan .............................. 49-22133

[52] U.S. Cl. .................................. 96/75; 96/91 D; 96/115 R; 101/453; 101/454; 101/457; 101/458; 101/459; 101/460
[51] Int. Cl.² ........................ G03C 1/52; G03C 1/68
[58] Field of Search ................ 96/91 D, 33, 115 R, 96/35.1, 75; 101/453, 454, 457, 458, 459, 460

[56] References Cited

UNITED STATES PATENTS

| | | | |
|---|---|---|---|
| 3,046,120 | 7/1962 | Schmidt et al. | 96/33 |
| 3,046,121 | 7/1962 | Schmidt | 96/33 |
| 3,046,122 | 7/1962 | Sus | 96/33 |
| 3,046,123 | 7/1962 | Sus | 96/33 |
| 3,201,239 | 8/1965 | Neugebauer et al. | 96/33 X |
| 3,502,470 | 3/1970 | Delzenne et al. | 96/91 D |
| 3,647,433 | 3/1972 | Rauner et al. | 96/91 D |
| 3,647,443 | 3/1972 | Rauner et al. | 96/91 D |
| 3,751,285 | 8/1973 | Ruckert et al. | 96/91 D X |
| 3,890,153 | 6/1975 | Dijkstra et al. | 96/91 D |

*Primary Examiner*—Thomas J. Herbert, Jr.
*Attorney, Agent, or Firm*—Sughrue, Rothwell, Mion, Zinn & Macpeak

[57] ABSTRACT

A light-sensitive lithographic printing plate comprising a support with a hydrophilic surface having thereon a light-sensitive layer comprising a light-sensitive polyester containing o-quinonediazido groups as terminal groups.

10 Claims, 3 Drawing Figures

LIGHT-SENSITIVE LITHOGRAPHIC PRINTING PLATE

BACKGROUND OF THE INVENTION

1. FIELD OF THE INVENTION

The present invention relates to a novel light-sensitive lithographic printing plate prepared by using a light-sensitive polyester containing an o-quinonediazido group as a terminal group.

2. Description of the Prior Art

It is well known to use light-sensitive quinonediazides for the production of photo copies and photoresists and for lithographic printing plates. These systems adroitly utilize the property that the solubility of the light-sensitive layer becomes different, as a result of exposure, between the exposed areas and the unexposed areas and, when treated with a suitable solvent, the desired image area remains on a support while unnecessary areas are washed away from the support. Detailed descriptions of this are given in U.S. Pat. Nos. 3,046,121, 3,046,122 and 3,046,123. In these patents, the above-described compounds are applied to a light-sensitive lithographic printing plate as naphthalenediazoxide esters or acid amides. In addition to these compounds, many compounds of this type have been reported.

However, most compounds of this type are low molecular weight compounds. Therefore, when these compounds are used alone, crystallization occurs and, as a result, a good film cannot be formed and the mechanical strength of the resulting images is so weak that it is difficult to make many copies thereof. Accordingly, these compounds are often used together with an alkalisoluble resinous binder or are used as a reaction product with an alkali-soluble resinous substance.

This type of polymer compounds is described in U.S. Pat. No. 3,046,120, British Pat. No. 1,113,759 and U.S. Pat. application Ser. No. 684,636, filed Nov. 21, 1967, now abandoned. The compounds described in these specifications are based on polymers such as a phenol resin, an aminostyrene resin, etc. Also, U.S. Pat. No. 3,647,443 describes light-sensitive quinonediazides having an o-quinonediazido group at the terminal of a polyalkylene glycol. However, these compounds possess the defect that coated layers prepared using them are fragile and have a comparatively poor flexibility, although they possess good light sensitivity and provide a sufficient difference in solubility between the exposed areas and unexposed areas.

SUMMARY OF THE INVENTION

Therefore, an object of the present invention is to provide a light-sensitive lithographic printing plate which does not possess the above-described defects and which is prepared using a light-sensitive quinonediazide resin comprising a novel polymer.

Further, an object of the present invention is to provide a lithographic printing plate which is stable with the lapse of time, and which is prepared by using a novel light-sensitive quinonediazide resin which comprises a polyester main chain having light-sensitive quinonediazide groups as terminal groups.

Another object of the present invention is to provide a light-sensitive lithographic printing plate having a light-sensitive layer in which the solubility in a developer solution of the exposed areas and the unexposed areas is greatly different.

A further object of the present invention is to provide a light-sensitive lithographic printing plate having excellent durability.

As a result of extensive research with the above-described objects in mind, it has been discovered that a light-sensitive lithographic printing plate which comprises a support with a hydrophilic surface having thereon a light-sensitive quinonediazide resin containing polyester as a main chain having light-sensitive quinonediazide groups at both terminals is extremely stable with the lapse of time and has excellent durability, thus achieving the present invention.

DETAILED DESCRIPTION OF THE INVENTION

Figure 1:
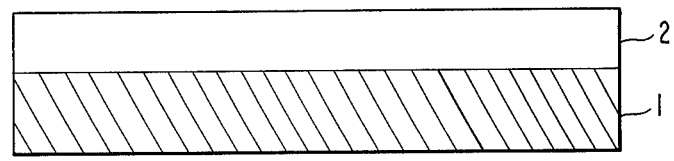
FIG. 1 is a cross sectional view of the light-sensitive lithographic printing plate of the present invention.

The light-sensitive lithographic printing plate of the present invention comprises a support having a hydrophilic surface and having thereon a light-sensitive layer containing mainly a novel light-sensitive quinonediazide compound.

The support to be used for the present invention is a dimensionally stable plate-like material. Such dimensionally stable plate-like materails include those which have heretofore been used as a support for printing plates. They can be suitably used for the present invention. Examples of such supports are paper, papers laminated with a synthetic resin (e.g., polyethylene, polypropylene, polystyrene, etc.), metal plates (e.g., aluminum (including aluminum alloys), zinc, copper, etc.), synthetic resin films (e.g., cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal, etc.) papers or plastic films laminated with or having deposited thereon a metal as described above, and the like. Of these supports, an aluminum support is particularly preferred since an aluminum support is dimensionally stable and inexpensive. Furthermore, a composite sheet comprising a polyethylene terephthalate film having an aluminum sheet thereon as described in Japanese Pat. Publication No. 18,327/73 is also preferred.

The surface of these supports must be particularly hydrophilic. Various methods can be used to provide such a hydrophilic surface. For example, with supports having a synthetic resin surface, the so-called surface-treating methods such as chemical treatment, flame treatment, ultraviolet light treatment, high frequency treatment, glow discharge treatment, laser treatment, etc. (e.g., as described in U.S. Pat. Nos. 2,764,520, 3,497,407, 3,145,242, 3,376,208, 3,072,483, 3,475,193, 3,360,448; British Pat. No. 788,365, etc.) and a method for providing a subbing layer after the above-described surface treatment can be used.

Various coating means are known. For example, coating methods include a double coating method which comprises coating as a subbing layer a resin layer having good adhesiveness to synthetic resins, and a single coating method which comprises coating a resin layer containing both hydrophobic groups and hydrophilic groups in the same polymer.

Also, with supports having a metal surface (particularly, an aluminum surface), it is preferable to conduct a surface treatment such as a dressing treatment, an immersion treatment comprising immersing the support in an aqueous solution of sodium silicate (e.g., as disclosed in U.S. Pat. No. 2,714,066), potassium fluorozirconate (e.g., as disclosed in U.S. Pat. No. 2,946,683), phosphate (e.g., as disclosed in U.S. Pat. No. 3,148,984), etc., an anodic oxidation treatment (e.g., as disclosed in British Pat. No. 781,814), or the like. In addition, an aluminum plate having been immersed in a sodium silicate aqueous solution after a dressing treatment as described in U.S. Pat. No. 2,714,066, and an aluminum plate having been subjected to an anodic oxidation treatment and immersed in an aqueous solution of an alkali metal silicate as described in U.S. Pat. Nos. 3,181,461 and 3,280,734 can preferably be used. The above-described anodic oxidation treatment is effected by applying an electric potential using an aluminum plate as an anode in an electrolytic solution comprising one or more of an aqueous or a non-aqueous solutions of an inorganic acid (e.g., phosphoric acid, chromic acid, sulfuric acid, boric acid, etc.), an organic acid (e.g., oxalic acid, sulfamic acid, etc.), or a salt thereof.

Also, the silicate electrodeposition as described in U.S. Pat. No. 3,685,662 is effective.

These above-described treatments are conducted in order to prevent harmful reaction with a light-sensitive composition provided thereon and to improve the intimate adhesiveness to a light-sensitive layer, as well as to make the surface of the support hydrophilic. In particular, with an aluminum support, the surface exhibits sufficient hydrophilicity without any particular treatment to render the surface hydrophilic. Therefore, in this case, the treatment is conducted mainly for preventing detrimental reactions with a light-sensitive composition and for improving the intimate adhesiveness between a light-sensitive layer and the surface of the support.

The novel light-sensitive quinonediazide compounds to be used in the present invention include those which have the following chemical structure:

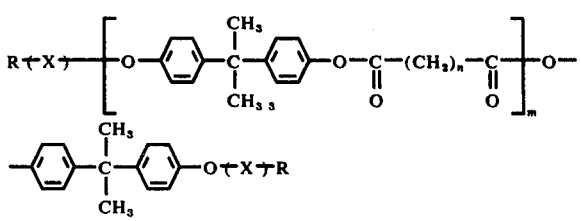

wherein X represents a sulfonyl group

a carbonyl group

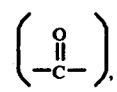

or the like; R represents an aromatic o-quinonediazido group (e.g., a 1,2-benzoquinonediazido group, a 1,2-naphthoquinonediazido group, a 3,3',4,4'-biphenyl-bis-quinonediazido group, a 2,3-phenanthrenequinonediazido group, etc.) including a substituted quinonediazido group substituted with a substituent which does not prevent the photolysis thereof such as an alkyl group (generally having 1 to 8 carbon atoms, such as a methyl group, an ethyl group, a propyl group, a butyl group, an amyl group, a hexyl group, a heptyl group, an octyl group, etc.), an alkoxy group (generally having 1 to 8 carbon atoms, such as a methoxy group, an ethoxy group, a propoxy group, a butoxy group, a pentoxy group, a hexoxy group, a heptoxy group, an octoxy group, etc.), or the like, $n$ represents an integer of 2 to 10, preferably 3 to 8, and $m$ represents an integer of 2 to 50, preferably 5 to 20.

A preferred example of the light-sensitive quinonediazide compound of the present invention is a polyester having 5-sulfonyl-1,2-naphthoquinonediazido groups as terminal groups, and is represented by the foregoing general formula wherein X is a sulfonyl group and R is a 1,2-naphthoquinone-2-diazido group. This compound is represented by the following structural formula:

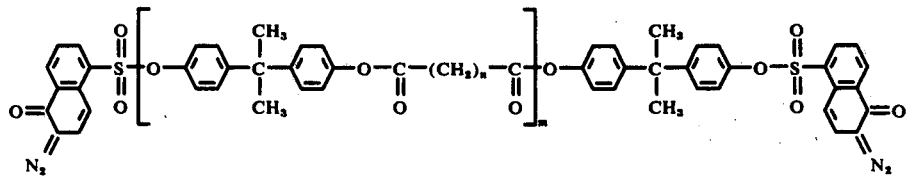

wherein $m$ and $n$ are the same as defined above.

The light-sensitive quinonediazide of the present invention can be obtained by first synthesizing a polyester having OH groups at both terminals of the main chain, and then reacting both terminals with a compound having a quinonediazide group. Such polyesters can be synthesized using general processes for synthesizing polyesters (e.g., as described in W. R. Sorenson & T. W. Campbell, Preparative Methods of Polymer Chemistry, John Wiley & Sons Inc., 1968, p. 139). For example, bisphenol A and a dicarboxylic acid dichloride having the formula $ClCO(CH_2)_nCOCl$ wherein n represents an integer of 2 to 10 are reacted. In synthesizing the polyester having OH groups at both terminals thereof, the diol component must be used in an excess amount to the dicarboxylic acid dichloride. In the preparation of such a polyester, the reaction is carried out in a inert anhydrous organic solvent such as nitrobenzene with an excess of the bisphenol A to the dicarboxylic dichloride (preferably an about 5 to 50 mol% excess) at a temperature of about 100° C to 150° C, preferably 140° C to 147° C, as a dispersion under an inert gas atmosphere such as nitrogen gas, for about 2 to 20 hours, Then, the solvent is distilled off under reduced pressure. The remaining solid is purified by a reprecipitation method. The yield of the polyester obtained is about 90 to 97% and the average molecular weight of the polyester obtained is about 900 to 17,000.

The resulting polyester is then reacted with a suitable reactive quinonediazido acid ester or acid halide (e.g., quinonediazidosulfonic acid chloride, quinonediazidocarboxylic acid chloride, etc.) to obtain the light-sensitive quinonediazide of the present invention. This reaction can be effected by reacting the polyester with the quinonediazido acid ester or acid halide in a solvent such as tetrahydrofuran in the presence of sodium carbonate or sodium hydride. These polyester quinonediazide compounds can be obtained as a yellow precipitate by adding the reaction mixture to a large amount of water under vigorous stirring, and can be removed as pure compound by repeatedly washing several times with water.

Useful quinonediazido-acid halides to be used for the reaction in the present invention include, for example, acid halides of o-benzoquinonediazido-1,2-naphthoquinone-1-diazide, 1,2-naphthoquinone-2-diazide, 7-methoxy-1,2-naphthoquinone-2-diazide, 7-methoxy-1,2-naphthoquinone-2-diazide, 6-chloro-1,2-naphthoquinone-2-diazide, 7-chloro-1,2-naphthoquinone-2-diazide, 6-nitro-1,2-naphthoquinone-2-diazide, 5-(carboxymethyl)-1,2-naphthoquinone-1-diazide, 3,3'4,4'-diphenyl-bis-quinone-4,4'-diazide, 2,3-phenanthrenequinone-2-diazide, etc.

The coating solution containing the light-sensitive quinonediazide resin of the present invention can be coated on a support by dispersing or dissolving the light-sensitive quinonediazide resin in an optional, suitable solvent or a mixed solvent commonly employed in the art. Typical solvents are ketones such as acetone, methyl ethyl ketone, methyl isobutyl ketone, etc., ethers such as tetrahydrofuran, dioxane, etc., methylene chloride, ethylene chloride, and the like.

The light-sensitive quinonediazide resins of the present invention are desirably used alone but, if desired, they can be used in combination with other binders. Illustrative suitable binders are alkali solution-soluble resins such as a phenolformaldehyde resin, a cresol resin, a styrene-maleic anhydride copolymer, shellac, and the like. These resins possess the common property of being soluble in an alkaline solution, and have excellent adhesiveness to the support and durability. A suitable amount of the alkali-solution-soluble resin in the light-sensitive layer is about 10 to 50% by weight, preferably 25 to 40% by weight.

The concentration of the coating solution varies depending upon the kind of light-sensitive quinonediazide resin, the support, and the coating method employed. A particularly useful coating layer is obtained when the coating solution contains a light-sensitive quinonediazide resin in an amount of about 1 to 50% by weight, preferably about 2 to 10% by weight. Of course, concentrations higher than this can provide good results as well.

Furthermore, it is also possible to add the following various additives to the light-sensitive layer of the light-sensitive printing plate of the present invention to thereby obtain improved properties. For example, dyes which serve to provide visible images through exposure and development can be employed. Suitable dyes include C.I. 26,105 (Oil Red RR), C.I. 21,260 (Oil Scarlet No. 308), C.I. 74,350 (Oil Blue), C.I. 52,015 (Methyl Blue), C.I. 42,555 (Crystal Violet), and the like. These dyes are employed in an amount to provide sufficient contrast so that the hydrophilic surface of the support of the light-sensitive lithographic printing plate in accordance with the present invention uncovered by imagewise exposure and development can be clearly discriminated from the remaining areas of the light-sensitive layer. In general, they are suitably incorporated in an amount of not more than about 7% by weight based on the total amount of the light-sensitive composition.

Also, plasticizers can be incorporated in the light-sensitive composition. Plasticizers are effective for imparting the desired flexibility to the light-sensitive layer on the support. For example, phthalic acid esters (e.g., dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, etc.), glycol esters (e.g., dimethyl glycol phthalate, ethyl phthalyethyl glycolate, methyl phthalyl ethyl glycolate, butyl phthalyl butyl glycolate, triethyleneglycol dicaprylate, etc.), phosphoric acid esters (e.g., tricresyl phosphate, triphenyl phosphate, etc.), aliphatic dicarboxylic acid esters (e.g., diisobutyl adipate, dioctyl adiphate, dimethyl sebacate, dibutyl sebacate, dioctyl azelate, dibutyl maleate, etc.), polyglycidylmethacrylate, triethyl citrate, glycerin triacetate, butyl laurate, etc., are effective. Plasticizers are employed in an amount of not more than about 5% based on the total amount of the light-sensitive composition.

Also, in order to obtain visible images immediately after exposing the light-sensitive lithographic printing plate of the present invention, spiropyran compounds which discolor upon exposure, such as 6-nitrobenzoindolinospiropyran, 1,3,3-trimethylindolino-8'-methoxy-6'-nitrobenzspiropyran, 6'-nitro-1,3,3-trimethylindolinobenzospiropyran, 1,3,3-trimethylindolinobenzospiropyran, 1,3,3-trimethylindolino-$\beta$-naphthospiropyran, benzo-$\beta$-naphthospiropyran, xantho-$\beta$-benzospiropyran, 6'-nitro-1,3,3-trimethylspiro(indoline-2,2'-2'-H-chromene), 6',8'-dichloro-1,3,3-trimethylspiro(indoline-2,2'-2'H-chromene), etc., as described in Japanese Pat. Publication No 6,413/69, can be incorporated in the light-sensitive composition. These compounds are suitably employed in an amount of about 2 to 20% by weight based on the total amount of the light-sensitive composition.

As the coating method, various conventionally known coating methods such as a dip-coating method, an air knife-coating method, a bead coating method, a curtain coating method, an extrusion coating method using a hopper as described in U.S. Pat. No. 2,681,294, and the like can be employed.

The light-sensitive layer is generally coated on a support in an amount of about 0.1 to 3 g/m$^2$. A coating amount suitable for obtaining about 10,000 to 100,000 impressions ranges from about 1 g/m$^2$ to 2.5 g/m$^2$. If sufficient care is taken in plate-making and printing, 5,000 good impressions can be obtained by coating an amount as small as about 0.1 g/m$^2$. Where greater durability is necessary, the light-sensitive layer is preferably coated in an amount nearly about 2.5 g/m$^2$. In this case, a considerable exposure amount is necessary upon imagewise exposure.

The light-sensitive lithographic printing plate of the present invention is exposed using a light rich in active rays, such as radiation from a carbon arc lamp, a mercury lamp, a xenon lamp, a tungsten lamp, etc., and processed with a developer to remove the exposed areas. Thus, the hydrophilic surface of the support at the exposed areas is uncovered.

After imagewise exposure as described above, the lithographic printing plate comprising the light-sensitive quinonediazide compound of the present invention is immersed in a developer such as an aqueous alkaline developer to remove the exposed areas. As the aqueous alkali developer, aqueous solutions of sodium hydroxide, potassium hydroxide, sodium silicate, potassium silicate, sodium tertiary phosphate, sodium primary phosphate, sodium carbonate, potassium carbonate, or the like, or of a basic organic compound (e.g., ethanolamine, etc.) are suitable. These alkaline aqueous solutions can be used individually or in combination. Where easy development is not achieved with these developers, it is useful to add to the alkaline aqueous solution a certain kind of organic solvent such as benzyl alcohol, 2-butoxyethanol, 2-methoxyethanol, n-propanol, etc., in a concentration of up to about 10% by weight.

Also, if necessary, a wetting agent (e.g., a surface active agent) can be added to these developers. Suitable wetting agents include compounds having 6 or more carbon atoms and containing a hydrophilic group such as a hydroxy group, a carboxy group, a sodium carbonate group, a sulfo group, a sodium sulfonate group, an alkyleneoxide group, etc. The wetting agents are compounds well known as anionic surface active agents or as nonionic surface active agents. Examples of anionic surface active agents are higher alcohol (having 8 to 22 carbon atoms) sulfuric acid ester salts, aliphatic alcohol phosphoric acid ester salts, dicarboxylic fatty acid ester sulfonates, aliphatic amide sulfonates, and the like. Examples of nonionic surface active agents are polyoxyethylene alkyl ethers, polyoxyethylene alkyl ethers, sorbitan alkyl esters, ethers such as polyoxypropylene, polyoxyethylene, etc. Specific examples of these surface active agents are described in detail in *Kaimen Kasseizai Binran* (*Handbook of Surface Active Agents*), published by Sangyo Tosho K.K. (1966).

Particularly preferred wetting agents for use in the present invention are Duponol ME (trade name of lauryl alcohol sulfate sodium salt, made by E. I. du Pont de Nemours & Co.), Monogen Y-100 (trade name for sodium lauryl sulfate, made by Dai-ichi Kogyo Seiyaku Co., Ltd.), the sodium salt of octyl alcohol sulfuric acid ester, the ammonium salt of lauryl alcohol sulfuric acid ester, the sodium salt of xylenol sulfuric acid ester, Duponol LS (trade name of oleyl alcohol sulfuric acid ester sodium salt, made by E. I. du Pont de Nemours & Co.), N,N-dihydroxyethylglycine monosodium salt, and the like. Of these, lauryl alcohol sulfuric acid ester sodium salt is the most preferred. These surface active agents can be used individually or in combinations of two or more. The amount thereof used is not particularly limited. However, generally, the surface active agents are used within the range of from about 0.005 to 30% by weight, preferably 0.5 to 10% by weight, most preferably 4 to 8% by weight, in the developer.

Development processing is effected by contacting the imagewise exposed lithographic printing plate of the present invention with the developer as described above. The contact can be effected by various methods such as immersion, spraying, etc. After contact with the developer for about 60 to 180 seconds according to the above-described methods, the printing plate is gently rubbed, if necessary, with a suitable brush to remove only the exposed areas, thus good development being achieved. In order to conduct the development more effectively, it is desirable to process the printing plate with a developer at temperatures higher than room temperature (about 20°~ 30° C), for example, at about 40° to 50° C.

For a further understanding of the present invention, description will be given by reference to the accompanying drawings.

FIG. 1 is a cross sectional view of the light-sensitive lithographic printing plate of the present invention which comprises support 1 having a hydrophilic surface (e.g., an aluminum support) and having thereon light-sensitive layer 2 containing as a major component the novel quinonediazide compound of the present invention.

Figure 2:
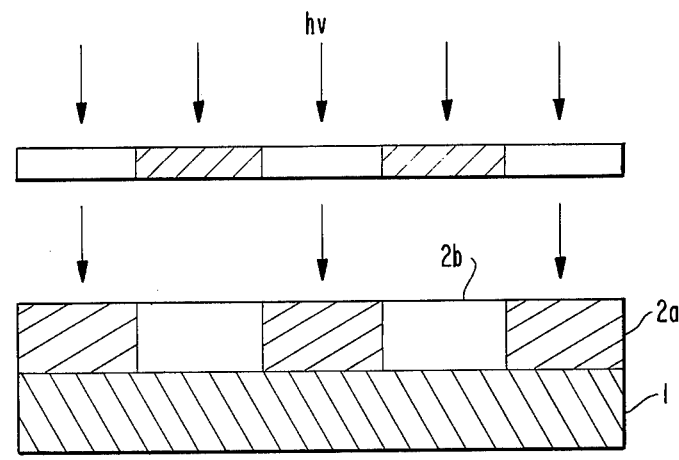
FIG. 2 is a cross sectional view of the light-sensitive lithographic printing plate of FIG. 1 after exposure.

FIG. 2 is a cross sectional view of the imagewise exposed light-sensitive lithographic printing plate illustrated in FIG. 1, wherein exposed areas 2a have become alkaline solution soluble.

Figure 3:
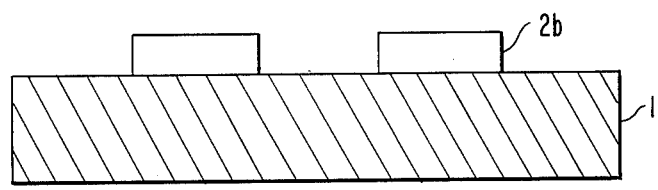
FIG. 3 is a cross sectional view of the light-sensitive lithographic printing plate, shown in FIG. 2, after development processing.

FIG. 3 is a cross sectional view of the imagewise exposed light-sensitive lithographic printing plate 1, shown in FIG. 2, after development processing. Exposed areas 2a of the light-sensitive layer are removed by development processing to uncover the hydrophilic surface of aluminum support 1. The hydrophilic surface is both hydrophilic and oleophobic. The nonexposed areas 2b of light-sensitive layer 2 remain after development processing, and are oleophilic and hydrophobic. Thus, the printing plate of the present invention is completed.

In the present invention, light-sensitive lithographic printing plates having excellent sensitivity and durability are obtained by using the novel light-sensitive quinonediazide compound. In addition, an advantage also of the lithographic printing plate of the invention is that it has excellent inking properties and preparation of damping water is very easy. In addition, the lithographic printing plate of the present invention is stable with the lapse of time.

Thus, very good impressions can be obtained with the lithographic printing plate of the present invention.

The present invention will now be described in greater detail by reference to the following non-limiting Synthesis Examples and Examples. Unless otherwise indicated herein, all parts, percents, ratios and the like are by weight.

SYNTHESIS EXAMPLE 1

21 g of polyester (polymerization degree $m = 13$) synthesized from bisphenol A and adipic acid chloride and having phenolic hydroxy groups at both terminals was dissolved in 100 ml of anhydrous tetrahydrofuran, and 1.0 g of sodium hydride was added incrementally thereto at room temperature under stirring, the reaction being conducted for about 30 minutes until the generation of hydrogen stopped. The thus obtained slurry-like solution was dropwise added to 100 ml of a tetrahydrofuran solution containing 7 g of 1 1-naphthoquinone-2-diazido-5-sulfonyl chloride over a 1 hour period. Thereafter, excess tetrahydrofuran was distilled off under reduced pressure to make the total amount 100 ml. Then, the reaction mixture was poured into 1 l of water for precipitation. After air-drying the precipitate, the precipitate was re-dissolved in 300 ml of dioxane and then reprecipitated in 3 l of water. After filtering out the precipitate, the precipitate was washed several times with water and dried under reduced pressure to obtain 18 g of the light-sensitive quinonediazide resin represented by the following formula:

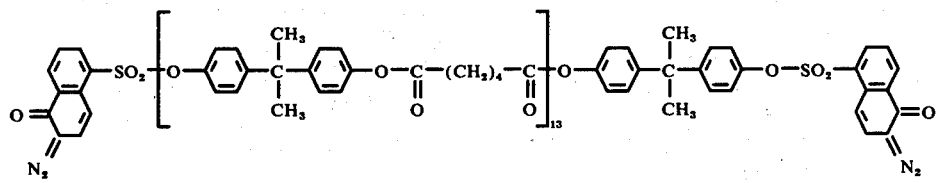

SYNTHESIS EXAMPLE 2

A polyester was synthesized from bisphenol A and sebacic acid chloride in the same manner as in Synthesis Example 1, followed by reaction with 1-naphthoquinone-2-diazido-5-sulfonyl chloride to obtain the light-sensitive quinonediazide resin of the following formula:

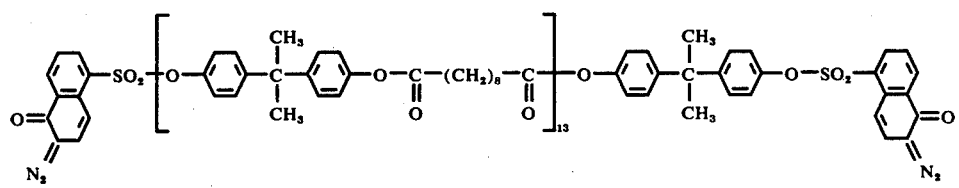

EXAMPLE 1

3.5 parts by weight of the light-sensitive quinonediazide resin prepared in Synthesis Example 1 was uniformly dissolved in 20 parts by weight of methyl ethyl ketone, and the composition was coated on a grained aluminum plate in a dry amount of 2.7 g/m² using a rotary coater. The thus obtained light-sensitive lithographic printing plate was exposed for 40 seconds through a transparent positive image superposed thereon using a Plano PS Light made by Fuji Photo Film Co., Ltd. (3.5 A halogen lamp being used) separated at a distance of 1 m. Then, the plate was development-processed using an aqueous developer containing 5% by weight of sodium silicate and 1.5% by weight of 2-butoxyethanol to obtain a printing plate having a good positive image.

When printing was conducted using this printing plate and a Rota printer, more than 50,000 good impressions were obtained.

EXAMPLE 2

3.5 parts by weight of the light-sensitive quinonediazide resin prepared in Synthesis Example 2 was dissolved in 20 parts by weight of methyl ethyl ketone, and the composition was coated on a grained aluminum plate in a dry amount of 2.5 g/m².

This printing plate was exposed and development-processed in the same manner as in Example 1.

As a result of conducting printing using the resulting plate and a Rota printer, more than 45,000 good impressions were obtained.

EXAMPLE 3

1 part by weight of the compound obtained in Synthesis Example 1 and 2 parts by weight of a novolak type phenol resin were dissolved in 20 parts by weight of methyl ethyl ketone, and the composition was coated in a dry amount of 2.3 g/m² according to rotary coating. This light-sensitive lithograpic printing plate was exposed and development-processed in the same manner as in Example 1 to obtain a printing plate. As a result of printing using a Rota printer, more than 50,000 good impressions were obtained.

While the invention has been described in detail and with reference to specific embodiments thereof, it will be apparent to one skilled in the art that various changes and modifications can be made therein without departing from the spirit and scope thereof.

What is claimed is:

1. A light-sensitive lithographic printing plate comprising a support with a hydrophilic surface having thereon a light-sensitive layer comprising a light-sensitive polyester, containing o-quinonediazide groups as terminals, represented by the formula:

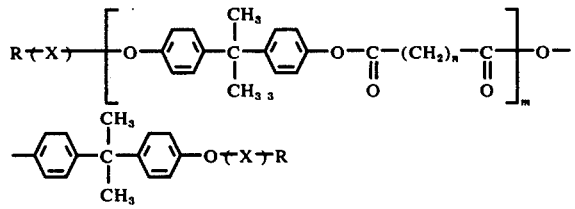

wherein X represents a sulfonyl group or a carbonyl group; wherein R represents an aromatic o-quinonediazide group in which the aromatic ring can be substituted with a substituent which does not hinder the photolysis of said o-quinonediazide group; n represents an integer of 2 to 10; and m represents an integer of 2 to 50.

2. The light-sensitive lithographic printing plate of claim 1, wherein said aromatic o-quinonediazide group is a 1,2-benzoquinonediazide group, a 1,2-naphthoquinonediazide group, a 3,3',4,4'-diphenyl-bis-quinonediazide group or a 2,3-phenanthrenequinonediazide group and wherein said substituent which does not hinder photolysis is an alkyl group or an alkoxy group.

3. The light-sensitive lithographic printing plate of claim 1, wherein said light-sensitive layer includes at least one of a dye, a plasticizer, or a spiropyran compound.

4. The light-sensitive lithographic printing plate of claim 1, wherein said light-sensitive layer is present in an amount of from about 0.1 to 3 g/m² of said support.

5. The light-sensitive lithographic printing plate of claim 1, wherein said light-sensitive layer includes an alkali solution-soluble resin.

6. The light-sensitive lithographic printing plate of claim 5, wherein said alkali solution-soluble resin is a phenol-formaldehyde resin, a cresol resin, a styrene-maleic anhydride copolymer or shellac.

7. The light-sensitive lithographic printing plate of claim 5, wherein said light-sensitive layer contains said alkali solution-soluble resin in an amount of about 10 to 50% by weight based on the total weight of said light-sensitive layer.

8. The light-sensitive lithographic printing plate of claim 1, wherein said support is a paper, a paper laminated with a synthetic resin, a metal, a synthetic resin film, a paper laminated with or having deposited thereon a metal layer, or a synthetic resin film laminated with or having deposited thereon a metal layer.

9. The light-sensitive lithographic printing plate of claim 3, wherein said support comprises an aluminum support or a polyethylene terephthalate film having thereon an aluminum layer.

10. A light-sensitive lithographic printing plate of claim 9, wherein said aluminum support is an anodically oxidized aluminum support.

* * * * *